(12) United States Patent
Chen et al.

(10) Patent No.: US 6,906,360 B2
(45) Date of Patent: Jun. 14, 2005

(54) STRUCTURE AND METHOD OF MAKING STRAINED CHANNEL CMOS TRANSISTORS HAVING LATTICE-MISMATCHED EPITAXIAL EXTENSION AND SOURCE AND DRAIN REGIONS

(75) Inventors: Huajie Chen, Danbury, CT (US); Dureseti Chidambarrao, Weston, CT (US); Omer O. Dokumaci, Wappingers Falls, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,134

(22) Filed: Sep. 10, 2003

(65) Prior Publication Data
US 2005/0051851 A1 Mar. 10, 2005

(51) Int. Cl.[7] .............................................. H01L 29/73
(52) U.S. Cl. ...................................... 257/204; 257/206
(58) Field of Search .................................. 257/204, 206

(56) References Cited

U.S. PATENT DOCUMENTS 5,268,324 A * 12/1993 Aitken et al. ............... 438/217
5,583,059 A * 12/1996 Burghartz ................... 438/319
6,358,806 B1 * 3/2002 Puchner ...................... 438/308
2004/0175872 A1 * 9/2004 Yeo et al. ................... 438/154

OTHER PUBLICATIONS

Nayak, Deepak K. et al.;"High–Mobility Strained–Si PMOSFET's," *IEEE Transactions On Electron Devices*, vol. 43, No. 10, Oct. 1996, pp. 1709–1716.

* cited by examiner

Primary Examiner—George Fourson
Assistant Examiner—Fernando L. Toledo
(74) Attorney, Agent, or Firm—Daryl K. Neff; H. Daniel Schnurmann

(57) ABSTRACT

A structure and method are provided in which an n-type field effect transistor (NFET) and a p-type field effect transistor (PFET) each have a channel region disposed in a single-crystal layer of a first semiconductor and a stress is applied at a first magnitude to a channel region of the PFET but not at that magnitude to the channel region of the NFET. The stress is applied by a layer of a second semiconductor which is lattice-mismatched to the first semiconductor. The layer of second semiconductor is formed over the source and drain regions and extensions of the PFET at a first distance from the channel region of the PFET and is formed over the source and drain regions of the NFET at a second, greater distance from the channel region of the NFET, or not formed at all in the NFET.

12 Claims, 7 Drawing Sheets

STRUCTURE AND METHOD OF MAKING STRAINED CHANNEL CMOS TRANSISTORS HAVING LATTICE-MISMATCHED EPITAXIAL EXTENSION AND SOURCE AND DRAIN REGIONS

BACKGROUND OF INVENTION

The present invention relates to the fabrication of semiconductor integrated circuits, and more specifically to an apparatus and method of making strained channel complementary metal oxide semiconductor (CMOS) transistors having epitaxial lattice-mismatched epitaxial extension and source and drain regions.

Both theoretical and empirical studies have demonstrated that carrier mobility in a transistor can be greatly increased when a stress of sufficient magnitude is applied to the conduction channel of a transistor to create a strain therein. Stress is defined as force per unit area. Strain is a dimensionless quantity defined as the change in a particular dimension of an item: for example, the change in the item's length, versus the initial dimension of that item: for example, its original length, when a force is applied in the direction of that dimension of the item: for example, in the direction of the length of the item's length. Strain can be either tensile or compressive. In p-type field effect transistors, the application of a compressive longitudinal stress, i.e. in the direction of the length of the conduction channel, creates a strain in the conduction channel which is known to increase the drive current of a PFET. However, if that same stress is applied to the conduction channel of an NFET, its drive current decreases.

It has been proposed to increase the performance of an NFET and a PFET by applying a tensile longitudinal stress to the conduction channel of an NFET and applying a compressive longitudinal stress to the conduction channel of a PFET. Such proposals have focused on masked processes involving the masking of a PFET portion of the chip and altering the materials used in shallow trench isolation regions near the conduction channel of the PFET to apply a desired stress thereto. Separate steps would then be performed to mask the NFET portion of the chip and alter the materials used in shallow trench isolation regions near the conduction channels of the NFET to apply a desired stress thereto. Other proposals have involved masked processes centered on modulating intrinsic stresses present in spacer features.

Silicon germanium is a desirable lattice-mismatched semiconductor for use in forming strained silicon transistor channels. A strain is created when a second semiconductor is grown onto a single-crystal of a first semiconductor when the two semiconductors are lattice-mismatched to each other. Silicon and silicon germanium are lattice-mismatched to each other such that the growth of one of them onto the other produces a strain in each which can be either tensile or compressive.

Silicon germanium grows epitaxially on silicon having a crystal structure aligned with the silicon crystal structure. However, because silicon germanium normally has a larger crystal structure than silicon, the epitaxially grown silicon germanium becomes internally compressed.

In other proposals using strained silicon, a substrate includes a very thick layer of silicon germanium. Alternatively, the bulk substrate consists of single-crystal silicon germanium. In either case, the silicon germanium layer or substrate is known as a relaxed layer because the strain is released by dislocations which form within the silicon germanium layer. When a single-crystal silicon layer is grown epitaxially on a relaxed layer of single-crystal SiGe, a tensile strain is produced in the epitaxially grown silicon crystal layer. This results in improved electron mobility, which improves the performance of an NFET.

However, such technique requires the SiGe to be relaxed, which requires that the SiGe layer be very thick, i.e. at least 0.5 to 1.0 $\mu$m thick. Improvements in the mobility of holes is difficult to obtain because to do so, the SiGe layer requires a large percentage of germanium, which can result in excessive dislocations in the SiGe crystal, causing yield problems. Further, processing costs can be prohibitive.

Other techniques such as graded Ge concentration and chemical mechanical polishing methods are used to improve the quality of the films. However, those techniques are plagued by high cost and high defect density.

Accordingly, it would be desirable to create a strain in the channel region of a PFET without the use of a thick SiGe crystal region. It would be desirable create a desired strain in a channel region of a device using an epitaxially grown SiGe film in source and drain regions of the PFET.

It would further be desirable for the SiGe film to be formed sufficiently thin to enable the SiGe film to apply a desirably high magnitude stress and avoid the SiGe film from becoming a relaxed film.

It would further be desirable to create a compressive strain to increase hole mobility in the channel region of a PFET by growing an epitaxial layer of SiGe in the source and drain regions of the PFET.

It would further be desirable to provide a process of forming raised source and drain regions extending above a level of the gate dielectric which include the lattice-mismatched semiconductor for creating a desirable strain in the channel region of the PFET.

It would further be desirable to provide a process for creating a desired strain in the channel region of a PFET without creating the same strain in the channel region of the NFET.

It would further be desirable to provide a structure and method for forming a lattice-mismatched semiconductor layer in source and drain regions of a PFET in close proximity to the channel region of the PFET while preventing the lattice-mismatched semiconductor layer from being formed in close proximity to the channel region of an NFET of the same integrated circuit.

It would further be desirable to provide a structure and method for forming a lattice-mismatched semiconductor layer in extension regions of a PFET in close proximity to the channel region of the PFET while preventing the lattice-mismatched semiconductor layer from being formed in extension regions in close proximity to the channel region of an NFET of the same integrated circuit.

SUMMARY OF INVENTION

According to an aspect of the invention, an integrated circuit having complementary metal oxide semiconductor (CMOS) transistors including a p-type field effect transistor (PFET) and an n-type field effect transistor (NFET) is provided. The NFET and the PFET each have a channel region disposed in a single-crystal layer of a first semiconductor, wherein a stress is applied at a first magnitude to a channel region of the PFET but not to a channel region of the NFET. The stress is applied by a layer of a second semiconductor which is lattice-mismatched to the first semiconductor. The layer of second semiconductor is formed in source and drain regions of the PFET a first distance from the channel region of the PFET. The layer of second semiconductor is further formed in source and drain regions of the NFET at a second distance from the channel region of the NFET, the second distance being greater than the first distance.

According to another aspect of the invention, a method is provided of fabricating an integrated circuit including a p-type field effect transistor (PFET) and an n-type field effect transistor (NFET). The NFET and the PFET each have a channel region disposed in a single-crystal region of a first semiconductor, a stress being applied to the channel region of said PFET in a first magnitude and not being applied to the channel region of the NFET at that first magnitude.

According to a preferred aspect of that method, a PFET gate stack and an NFET gate stack are formed over a single-crystal region of a first semiconductor, the PFET gate stack and the NFET gate stack each having a gate conductor overlying a gate dielectric formed on a main surface of the single-crystal region of a first semiconductor and first spacers including a first material formed on sidewalls of the gate conductor. Second spacers are formed on side-walls of the first spacers of the PFET gate stack and the NFET gate stack, the second spacers including a second material. Then, portions of the second material are removed from the second spacers of the PFET gate stack selective to the first material while protecting the second material from being removed from the second spacers of the NFET gate stack. Thereafter, a layer of a second semiconductor is grown on exposed areas of the single-crystal region of the first semiconductor, the second semiconductor being lattice-mismatched to the first semiconductor, such that a stress is applied to the channel region of said PFET at a first magnitude and not applied to the channel region of the NFET at the first magnitude. Source and drain regions are fabricated to complete the PFET and the NFET.

DETAILED DESCRIPTION

Figure 1:
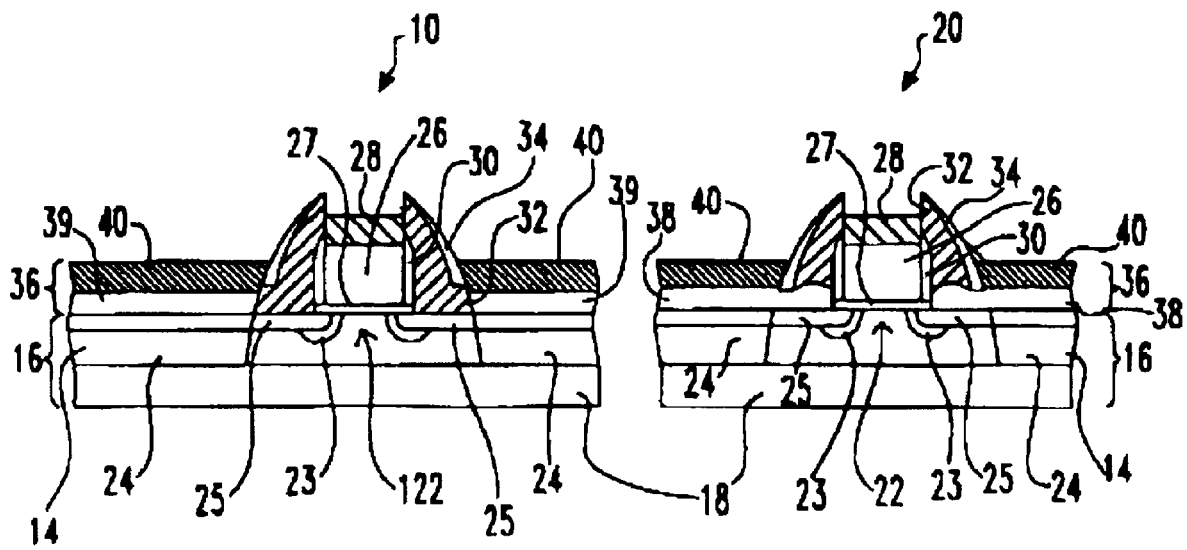
FIG. 1 illustrates a PFET and an NFET according to an embodiment of the invention.

FIG. 1 illustrates a p-type field effect transistor (PFET) and an n-type field effect transistor (NFET) according to an embodiment of the invention. As illustrated in FIG. 1, the NFET 10 and PFET 20 are fabricated in a single-crystal semiconductor region 14 of a substrate 16. The substrate 16 may either be a bulk substrate or may preferably be a semiconductor-on-insulator substrate such as a silicon-on-insulator (SOI) substrate in which a relatively thin single-crystal region of a semiconductor is formed over an insulating layer 18. When field effect transistors (FETs) are formed in such SOI substrates, faster switching operation is often achieved than otherwise, because junction capacitance between the channel region of the transistor and the bulk substrate is eliminated. The substrate preferably includes a single-crystal silicon region 14, and is more preferably an SOI substrate having a single-crystal silicon region 14 above an insulating layer 18.

As described in this and the embodiments to follow, reference will be made to the fabrication of NFET and PFET transistors having channel regions disposed within a single-crystal region of a substrate preferably consisting essentially of a first semiconductor such as silicon. As the first semiconductor is preferably silicon, the lattice-mismatched second semiconductor is preferably a different semiconductor such as silicon germanium or silicon carbide, and more preferably silicon germanium ($Si_xGe_y$) where x and y are percentages where x plus y equals 100 percent. The ranges of variation between x and y can be rather large, y illustratively varying from 1% to 99%, and in such case, x consequently varying between 99% and 1%.

However, the present invention is not limited to the fabrication of transistors in a pure silicon crystal. The single crystal region of the substrate 14 may consist essentially of silicon germanium in proportions according to a first formula $Si_{x1}Ge_{y1}$, where x1 and y1 are percentages where x1+y1=100%, and the layer of the second semiconductor consists essentially of silicon germanium in different proportions according to a second formula $Si_{x2}Ge_{y2}$, where x1 and y1 are percentages where x2+y2=100%, x1 being not equal to x2, and y1 being not equal to y2. The second semiconductor, being lattice-mismatched to the first semiconductor, is formed by epitaxial growth in source and drain regions of the PFET in close proximity to the channel region of the PFET while the lattice-mismatched second semiconductor is simultaneously prevented from being formed in close proximity to the channel region of the NFET.

Figure 2:
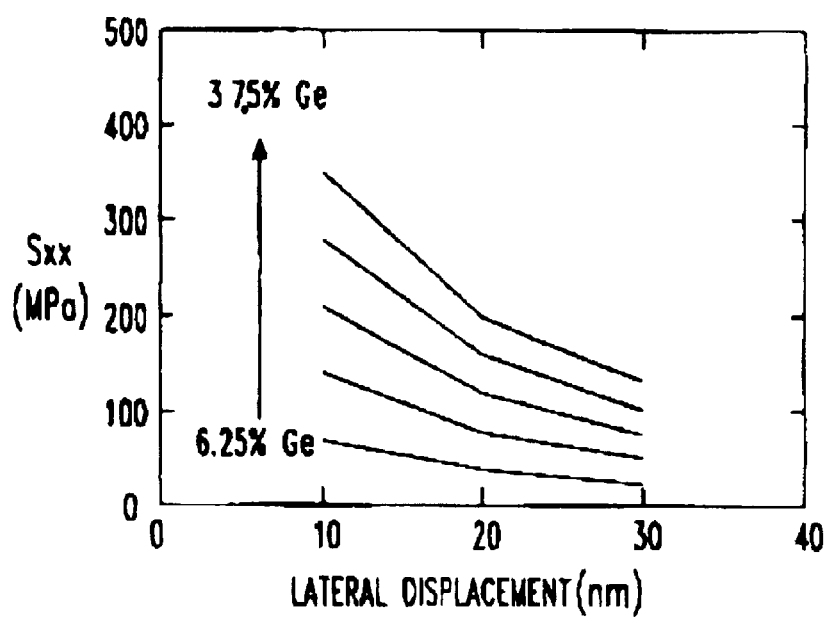
FIG. 2 graphically illustrates magnitudes of compressive stress induced in a single-crystal silicon region of interest by a thin epitaxial layer of silicon germanium.

FIG. 2 is an aid to understanding principles on which the structure and method of the present embodiments of the invention are founded. FIG. 2 graphically illustrates magnitudes of compressive stress induced in a single-crystal silicon region of interest by a thin epitaxial layer of silicon germanium that is laterally displaced from the region of interest. The curves in FIG. 2 represent magnitudes of compressive stress, as mapped in relation to lateral displacement from the edge of the region of interest, for different percentage concentrations of germanium in the epitaxial layer.

As shown in FIG. 2, a SiGe layer having a Ge percentage of 37.5% applies a stress of 350 MPa to a region of a single-crystal silicon at a lateral displacement of 10 nm. However, as the lateral displacement from the SiGe layer is increased, the magnitude of the stress decreases rapidly. For the same Ge percentage of 37.5%, the stress decreases to 150 MPa at a lateral displacement of 30 nm. SiGe layers having lower percentages are also graphed. A SiGe layer having a Ge percentage of 6.25% applies a stress of 75 MPa to a region of single-crystal silicon at a lateral displacement of 10 nm. However, the stress decreases to about 30 MPa when applied at a lateral displacement of 30 nm. The other curves in the chart indicate that stress induced in the channel increases as the Ge content increases.

The embodiments described herein take advantage of the rapid decrease in stress with lateral displacement to form the PFET having the strain-inducing lattice-mismatched source and drain regions in close proximity to the channel region.

On the other hand, the NFET is formed having the strain-inducing lattice-mismatched source and drain regions not in close proximity to the channel region.

The teachings of the present invention shall be understood to apply to the fabrication of transistors in other types of semiconductors such as in III-V compound semiconductors having a composition $Al_A In_B Ga_C As_D P_E N_F$, wherein A, B, C, D, E and F represent the respective percentages of each element Al, In, Ga, As, P and N in the semiconductor crystal, the percentages totaling 100. Gallium arsenide (GaAs), indium phosphide (InP), gallium nitride (GaN), and InGaAsP being common examples of such semiconductors.

As further shown in FIG. 1, the PFET 20 includes a channel region 22 disposed below a gate conductor preferably having a lower layer of heavily doped polysilicon 26 in contact with a gate dielectric 27. The gate dielectric 27 is preferably a layer of silicon dioxide thermally grown on the single-crystal semiconductor region 14. Preferably, halo regions 23 and extension regions 25 are preferably disposed adjacent to the source and drain regions 24 in the vicinity of the channel region 22.

The polysilicon lower layer 26 of the gate conductor is preferably heavily doped to a concentration of about $10^{19}$ cm$^{-3}$. Preferably, the polysilicon layer 26 of the PFET 20 includes a p-type dopant such as boron for the purpose of matching the workfunction of the p-type conduction channel that exists when the PFET is turned on in operation. The gate conductor preferably also includes a low-resistance portion 28 disposed above the polysilicon portion 26. The low-resistance portion 28 has much less resistance than the polysilicon portion 26, and preferably includes a metal, a silicide of a metal, or both. In a preferred embodiment, the low-resistance portion 28 includes a silicide formed by a self-aligned process (a "salicide"), being a silicide of any suitable metal including but not limited to tungsten, titanium and cobalt. More preferably, the silicide is a compound of cobalt ($CoSi_2$).

Alternatively, the gate conductor can include a metal layer in the place of a polysilicon layer in contact with the gate dielectric 27, the metal layer preferably having been formed as a replacement gate after high temperature processing of the source and drain regions of the transistor has been completed.

The source and drain regions 24 of the NFET 10 and PFET 20 are formed in the single-crystal silicon region 16, spaced from the channel regions 122 and 22 of the NFET 10 and the PFET 20, respectively, by pairs of first spacers, second spacers 32, and third spacers 34. A pair of raised source-drain regions 36 including an epitaxial layer of silicon germanium 39 and a low-resistance layer 40 are disposed over the source and drain regions 24 of the NFET 10. A pair of raised source-drain regions 36 including a layer of silicon germanium 38 and a low-resistance layer 40 are disposed over the source and drain regions 24 of the PFET 20. The low-resistance layer is preferably a silicide formed in self-aligned manner, i.e. a "salicide", from a metal deposited on the layers 38, 39 of silicon germanium and thereafter reacted with the silicon germanium to form the silicide. The silicide can be a compound of any suitable metal including but not limited to tungsten, titanium and cobalt. More preferably, the silicide is of cobalt, i.e. $CoSi_2$.

As shown in FIG. 1, the layer of silicon germanium 38 laterally extends to a sidewall of a first spacer 30 of the PFET 20 and under second and third spacers 32 and 34. In such manner, the epitaxial layer 38 of silicon germanium is located in close proximity to the channel region 22 of the PFET to apply a compressive stress capable of benefiting hole mobility in the channel region 22. The width of the first spacer 30 is preferably 10 nm or less in order for the epitaxial layer 38 to apply a stress having a desirable magnitude to the channel region 22.

In contrast to the PFET 20, the epitaxial layer 39 in the NFET 10 is laterally displaced from the channel region 122 by a distance spanning the width of at least the first and second spacers 30, 32. In such manner, the epitaxial layer 39 of silicon germanium is not located sufficiently close to the channel region 122 of the NFET to harmfully affect NFET performance.

FIGS. 3 through 12 illustrate stages of a CMOS fabrication process according to an embodiment of the invention. As a result of processing according to the embodiment, a p-type field effect transistor (PFET) and an n-type field effect transistor (NFET) are formed. In the PFET, a stress is applied to the channel region in a first magnitude by a lattice-mismatched semiconductor layer. On the other hand, in the channel region of the NFET, a stress in the first magnitude is not applied since the lattice-mismatched semiconductor layer is not located in close proximity to the NFET channel region. In such manner, an increase in carrier mobility of the PFET is achieved while still maintaining desirable performance in the NFET.

Figure 3:
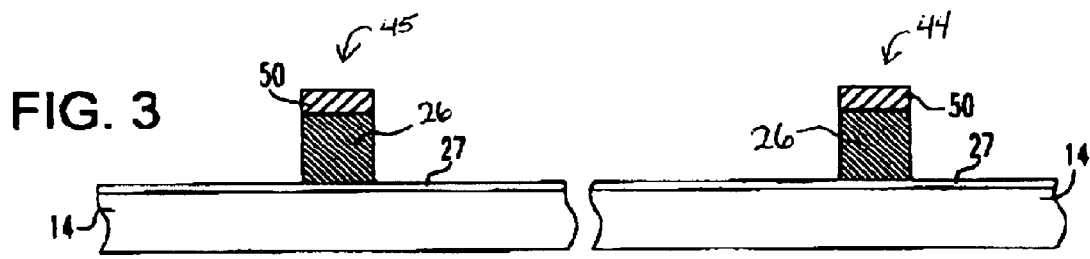
FIGS. 3 through 11 illustrate stages in fabrication of a PFET and an NFET according to an embodiment of the invention.

FIG. 3 illustrates a stage in processing to form a PFET and an NFET according to an embodiment of the invention. As shown in FIG. 3, a PFET gate stack 44 and an NFET gate stack 45 are formed overlying a single-crystal semiconductor region 14 of a substrate. The single-crystal region 14 consists essentially of a first semiconductor material as described above. The PFET gate stack 44 includes a gate dielectric 27 overlying the single-crystal region 14, a gate conductor layer 26 preferably including polysilicon in contact with the gate dielectric and an insulating cap 50, preferably consisting essentially of silicon nitride. The NFET gate stack 45 includes a gate dielectric 27 overlying the single-crystal region 14, a gate conductor layer 26 preferably including polysilicon in contact with the gate dielectric 27 and an insulating cap 50, preferably consisting essentially of silicon nitride.

In an embodiment, the gate conductors 26 of the PFET gate stack and the NFET gate stack are already provided at this stage with desired dopant types and concentrations to provide desirable workfunctions. For example, the PFET gate stack 44 may be provided with a p+ doped gate conductor layer 26 while the NFET gate stack 45 may be provided with an n+ doped gate conductor layer 26.

Figure 4:
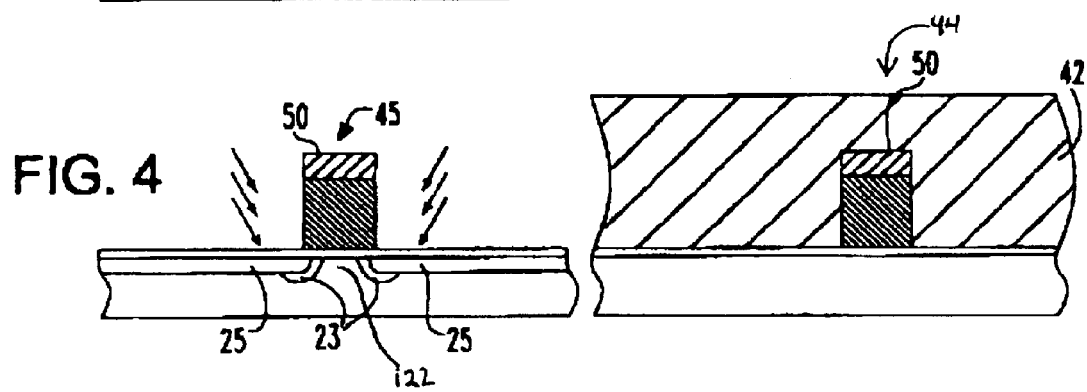

Next, as shown in FIG. 4, extension and halo implants are preferably performed into the active area of the single-crystal region 14 adjacent to the NFET gate stack 45, using the NFET gate stack 45 as a mask to prevent implants from penetrating too deeply into the channel region 122 below the NFET gate stack 45. During such implants, the active area adjacent to the PFET gate stack 44 is prevented from being implanted, as by a block mask 42 preferably including a photoresist material.

Figure 5:
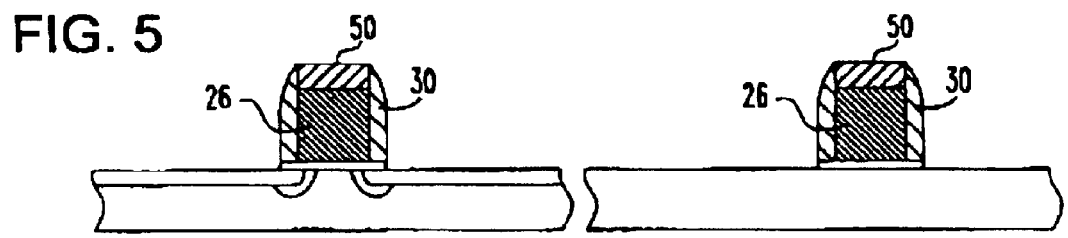

Next, as shown in FIG. 5, the block mask 42 is removed and pairs of first spacers 30 are formed on the sidewalls of the PFET gate stack 25 and NFET gate stack 45. The spacers 30 are preferably formed of a deposited nitride such as silicon nitride and are preferably thin, e.g. ranging from 3 nm to 20 nm in thickness, more preferably between 5 nm and 15 nm in thickness, and most preferably about 10 nm in thickness.

Figure 6:
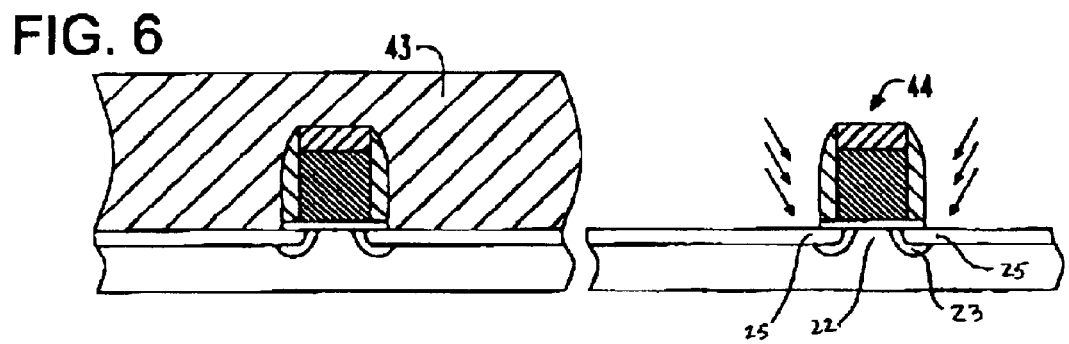

Next, as shown in FIG. 6, extension and halo implants are preferably performed into the active area of the single-crystal region 14 adjacent to the PFET gate stack 44, using the PFET gate stack 44 as a mask to prevent implants from penetrating too deeply into the channel region 22 below the PFET gate stack 44. During such implants, the active area adjacent to the NFET gate stack 45 is prevented from being implanted, as by a block mask 43 preferably including a photoresist material.

Figure 7:
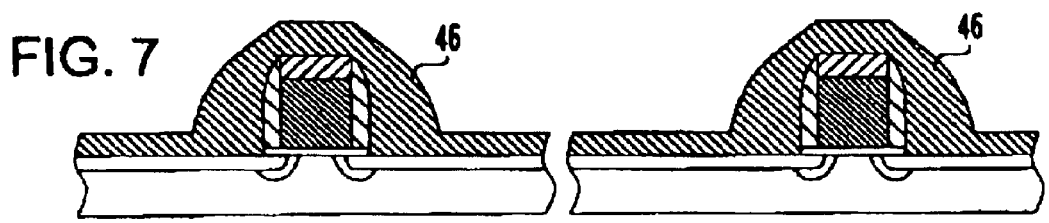

Thereafter, as shown in FIG. 7, the block mask 43 is removed and a thick conformal material layer 46 is deposited over the PFET gate stack 44 and NFET gate stack 45. The conformal material layer 46 should be insulative rather than conductive or semiconductive in nature. Preferably, the conformal material layer 46 includes an oxide, preferably being silicon dioxide, and is preferably deposited at a low temperature such as from a tetraethylorthosilicate (TEOS) precursor. Hereinafter, the material of this layer 46 is referred to as "oxide".

Figure 8:
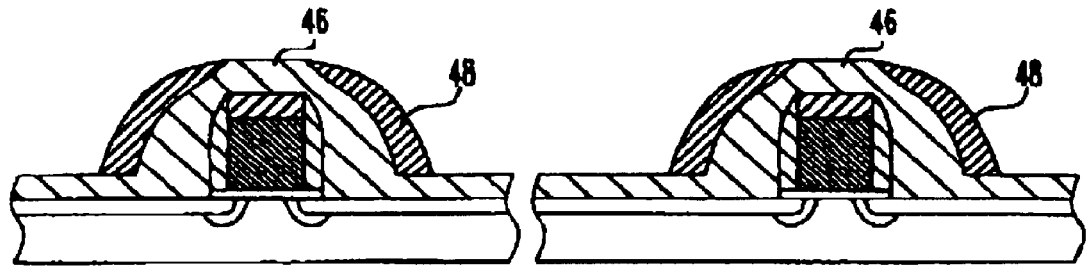

Next, as shown in FIG. 8, an additional, i.e. a third, pair of spacers 48 preferably including a nitride material, more preferably being silicon nitride, is formed over the oxide layer 46 on both the PFET gate stack 44 and the NFET gate stack 45. This process is preferably performed by depositing a conformal layer of silicon nitride and then vertically etching the structure as by a reactive ion etch (RIE) such that the spacers 48 remain on the sidewalls of the oxide layer 46 but the conformal nitride layer is removed from horizontal surfaces.

Figure 9:
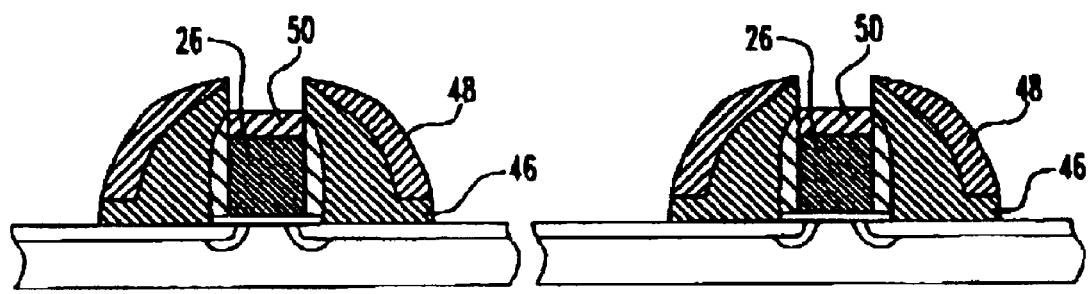

Next, as shown in FIG. 9, after the nitride spacers 48 are in place, the oxide layer 46 is etched, as by RIE selective to nitride, from the top surface of the structures down to the level of the insulating caps 50 on both the PFET gate stack 44 and the NFET gate stack 45. During such etch the oxide layer 46 is also removed from areas of the single-crystal region 14 that extend beyond the nitride spacers 48 on each of the PFET gate stack 44 and the NFET gate stack 45. During such etch, the nitride spacers 48 protect the sidewalls of the structures from being etched, and the insulating caps 50 protect the gate conductors 26 of the PFET gate stack and the NFET gate stack from damage and/or being etched.

Figure 10:
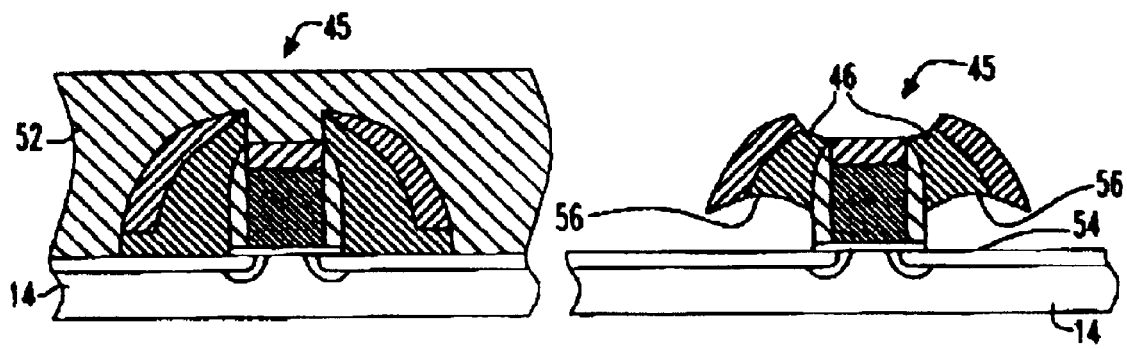

Thereafter, as shown in FIG. 10, a block mask 52 is again applied over an area including the NFET gate stack 45 while the PFET gate stack 44 remains exposed. The block mask 52 preferably includes a photoresist material. With the block mask 52 in place, the oxide layer 46 adhering to the PFET gate stack 44 is undercut, as by an isotropic wet chemical etch selective to nitride. This results in the oxide layer 46 having the appearance shown in FIG. 10. As a result of this etch, the main surface 54 of the single-crystal semiconductor region 14 is exposed.

Figure 11:
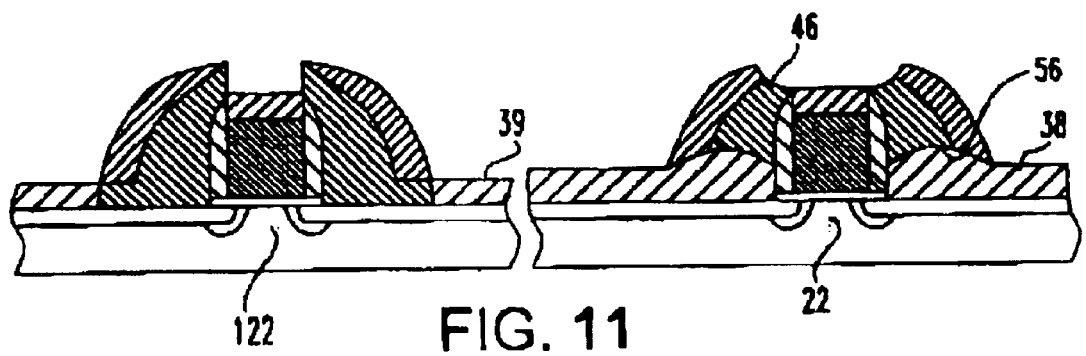

Thereafter, as shown in FIG. 11, a single-crystal layer of a second semiconductor, lattice-mismatched to the first semiconductor, is epitaxially grown onto the main surface of the single-crystal semiconductor region 14. As described above relative to FIG. 1, the second semiconductor is preferably silicon germanium having a higher percentage of germanium than that of the single-crystal semiconductor region 14, whether or not that region 14 has any germanium content or not. In the PFET region, this layer 38 is formed under the undercut portion 56 of the oxide layer 46 such that it applies a compressive stress in close proximity to the channel region 22 of the PFET 20, the layer 38 being laterally spaced from the channel region 22 only by the first nitride spacer 30.

On the other hand, in the NFET the silicon germanium layer 39 is not formed in as close proximity to the gate conductor 26 such that it does not apply a compressive stress to the channel region 122 of the NFET in as great a magnitude as the compressive stress applied to the channel region 22 of the PFET because a compressive stress hinders electron mobility in an NFET. However, if the lattice-mismatched semiconductor layer that induces the stress is displaced an adequate distance from the channel region 122 of the NFET 10, then the compressive stress can be tolerated, as described above relative to FIG. 2. Additionally, parameters of the spacers 30 and oxide layer 46 can be tailored to apply a lower magnitude counter stress to improve electron mobility in the NFET. Such counter stress would be applied as a low magnitude tensile stress to counter the effects of the low magnitude compressive stress applied by the silicon germanium layer 39 in the NFET channel region 122.

A final processing stage of this embodiment is illustrated in FIG. 1. During this stage of processing, source and drain regions 24 of the PFET 20 are implanted into the single-crystal region 14 using the PFET gate stack 44 structure including the gate conductor 26, first spacers 30, second spacers 32 and third spacers 34 as a mask while areas of the NFET 10 are protected from such implanting by a block mask. (not shown). In a preferably separate implant step, source and drain regions 24 of the NFET 10 are implanted into the single-crystal region 14 using the NFET gate stack 45 including the gate conductor 26, first spacers 30, second spacers 32 and third spacers 34 as a mask while the PFET 20 is protected from such implanting by a block mask (not shown). Thereafter, high temperature processing can be performed to anneal the implanted source and drain regions 24 and to drive the implanted dopant to the desired depth and lateral dimensions.

At this time, the nitride insulating caps 50 are removed from the PFET gate stack 44 and the NFET gate stack 45. Preferably, a silicide-forming metal is then deposited over the structures shown and then reacted by high temperature processing with the semiconductor material of a polysilicon gate conductor 26 in contact therewith and with the layers 38 and 39 of silicon germanium in contact therewith to form a self-aligned silicide ("salicide") 40. Alternatively, following the high temperature anneal of the source and drain regions 24, the nitride insulating caps 50 and the polysilicon gate conductors 26 can be removed from between the spacers 30, 32 as by RIE selective to nitride and oxide and a metal replacement gate be formed in its place. In such alternative process, the gate dielectric formed prior thereto preferably functions as an etch stop layer, i.e. as a sacrificial layer, for the polysilicon RIE. The first formed gate dielectric is removed after the RIE removal of the polysilicon gate 26 due to damage suffered by that layer during RIE. Thereafter, a second gate dielectric 27 is deposited in the place formerly occupied by the removed first gate dielectric. The metal gate conductor is then deposited in the openings formed thereby between the spacers 30, 32 as a conformal layer over the layers 38, 39 of the single-crystal silicon germanium. In such way, a metal replacement gate is formed after substantially completing processing of the PFET 20 and NFET 10.

Figure 12:
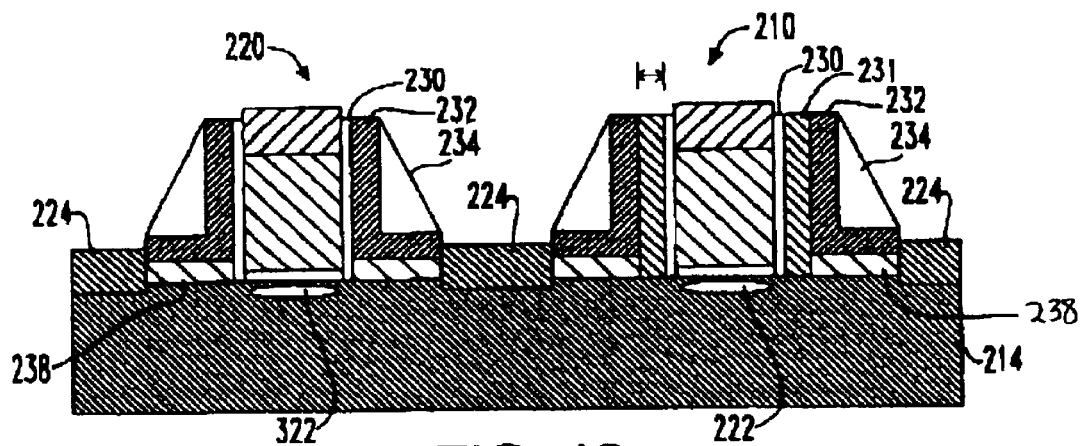
FIGS. 12 through 18 illustrates stages in fabrication of a PFET and an NFET according to another embodiment of the invention.

Another embodiment of a PFET 220 and an NFET 210 formed according to the invention is illustrated in FIG. 12. In this embodiment, as many as four pairs of spacers are utilized in the NFET 210 for displacing raised silicided source and drain regions 224 a desirable distance from the channel region of the NFET 210 and for displacing raised silicided source and drain regions 224 a desirable distance from the channel region of the PFET 220. As further shown in FIG. 12, a lattice-mismatched semiconductor layer 238 of a PFET is formed as a raised layer contacting the single-crystal semiconductor region 214 in close proximity to the channel region 322 of the PFET. In the NFET 210, a lattice-mismatched semiconductor layer 239 is formed as a raised layer but not in as close proximity to the channel region 222 of the NFET 210 due to the presence of an additional spacer 231 between the layer 239 and the channel region 222. In this embodiment, a compressive stress is applied in different magnitudes to the channel regions 222, 322 of both the NFET and PFET by the layers 239, 238.

In this embodiment, the amount of a strain created in the channel region of the NFET 210 can be tailored based on the width 240 of the second spacer 231. As discussed above, a greater lateral displacement of the layer 239 from the channel region 222 of the NFET 210 creates a lower strain in the channel region 222 of the NFET. Lower strain, in turn, affects electron mobility in the NFET 210 less negatively than a higher strain. In this embodiment, such lower strain can be achieved by the use of an appropriately sized spacer consisting essentially of a material such as silicon nitride.

The spacer 231 has a width 240 determined by a thickness of a deposited conformal silicon nitride material. If still lower strain is needed in the channel region 222 of the NFET 210, the thickness of the silicon nitride spacer 231 can be made larger by depositing that layer to a greater thickness.

Figure 13:
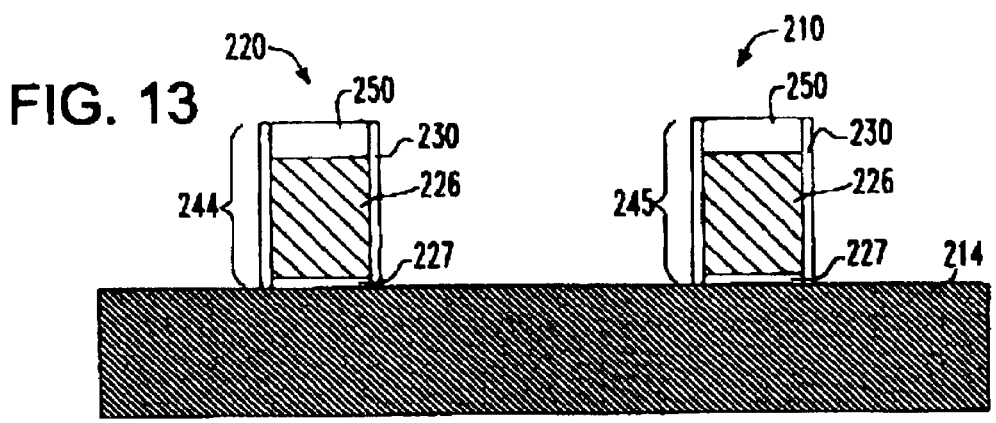

Stages in fabrication of the embodiment will now be described relative to FIGS. 13 through 18. As shown in FIG. 13, a PFET gate stack 244 and an NFET gate stack 245 each include a polysilicon gate 226 overlying a gate dielectric 227 preferably of a thermally grown oxide on a single-crystal semiconductor region 214 of a substrate such as a single-crystal silicon region. Insulating caps 250 overlie the polysilicon gates 226. Pairs of first spacers 230 are formed on sidewalls of the polysilicon gates 226 after patterning and etching the gate stack structures 244, 245. These first spacers 230 are preferably thin, ranging in width between 3 nm and 20 nm, more preferably between nm and 15 nm, and most preferably about 10 nm in width.

Figure 14:
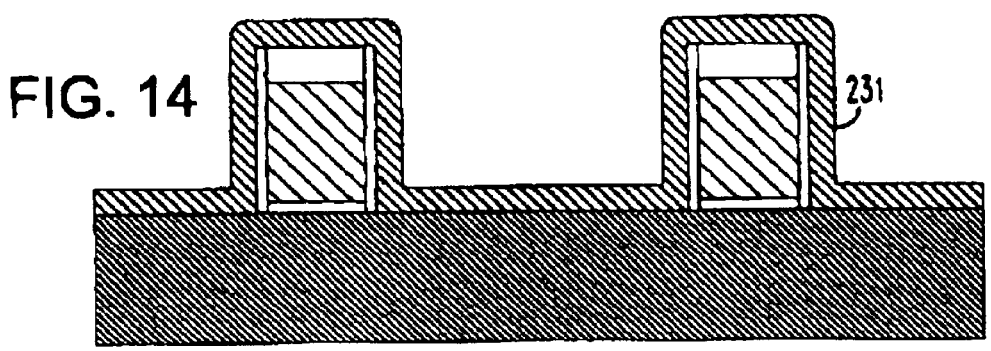
Figure 15:
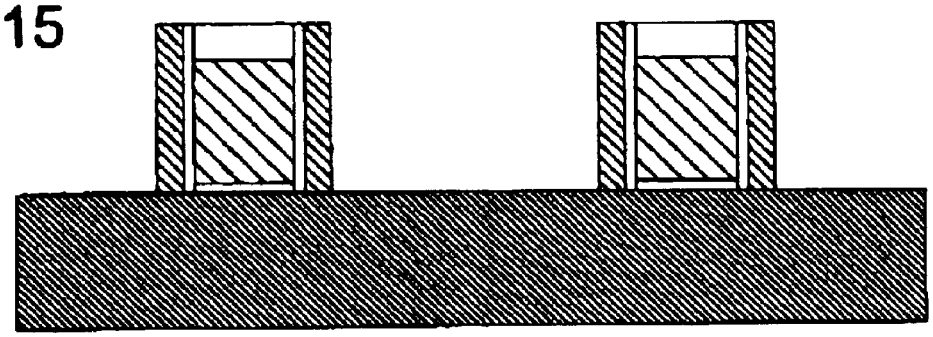

After forming the spacers 230, halo and extension ion implants are performed into source and drain regions (not shown) of the PFET 220 and the NFET 210 adjacent to the spacers, preferably by block masking NFET regions while implanting the PFET regions and then block masking PFET regions while implanting the NFET regions. Thereafter, as shown in FIGS. 14 and 15, second pairs of spacers 231 are formed on sidewalls of the first pairs of spacers 230. This is done by a process of depositing a conformal material such as silicon nitride, and thereafter vertically etching the structure, as by RIE, to provide the structure shown in FIG. 15.

Figure 16:
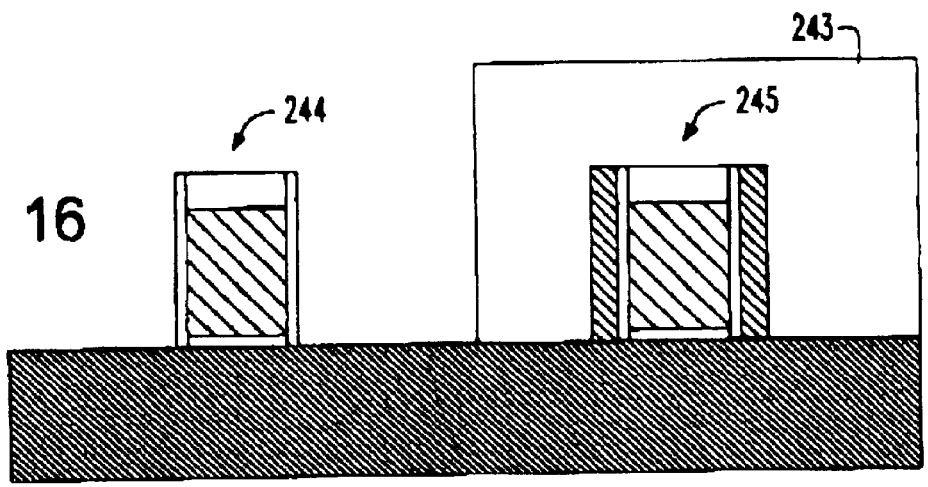
Figure 17:
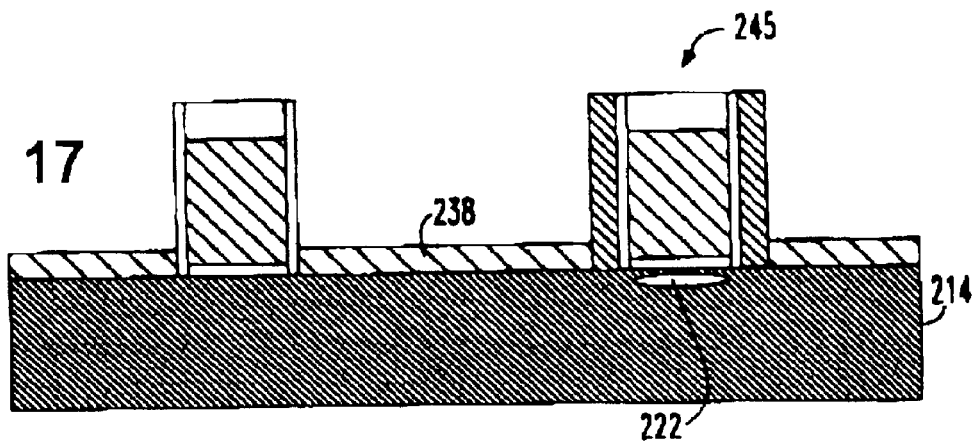

Thereafter, as shown in FIG. 16, a block mask 243 is applied over the NFET gate stack 245 and adjacent areas. The second spacers 231 are then removed from the PFET gate stack 244. Next, as shown in FIG. 17, a layer of silicon germanium 238 is selectively grown over the single-crystal region 214 of the substrate. Due to presence of the second spacers 231 on sidewalls of the NFET gate stack 245, the layer 238 of silicon germanium is laterally displaced from the channel region 222 of the NFET by a greater distance (e.g. by the width 240 of the spacer 231) than it is to the channel region 322 of the PFET. In such manner, greater hole mobility is achieved in the PFET without severely affecting electron mobility in the NFET.

Figure 18:
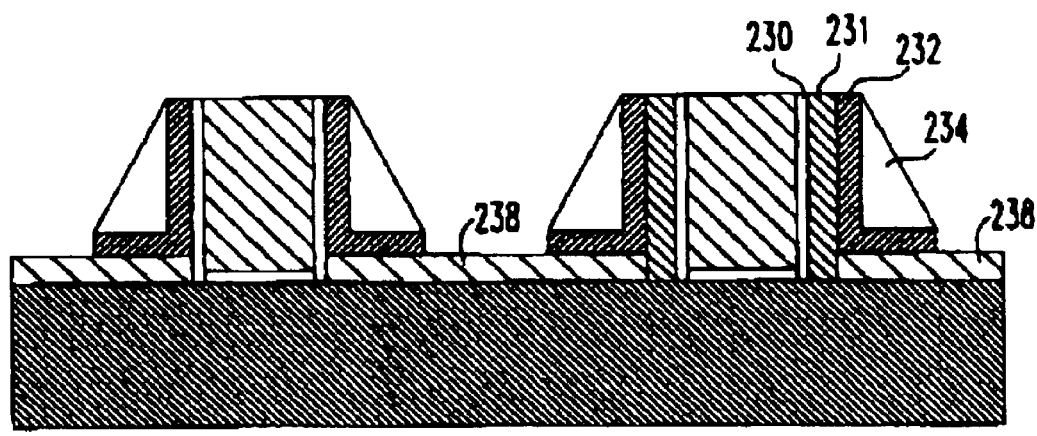

Next, as shown in FIG. 18, further spacers 232 and 234 are formed. These spacers 232 and 234 are used to space the final raised silicided source and drain regions 224 (FIG. 12) from the channel regions 222 and 322 of the NFET and the PFET respectively. These spacers 232, 234 preferably include nitride and oxide, respectively. Preferably, spacer 232 consists essentially of nitride and spacer 234 consists essentially of oxide. During this process, additional RIE etches are performed, resulting in the structure shown in FIG. 18. Finally, self-aligned silicide layers 224 are formed in areas of layer 238 that are not covered by the gate stacks 244 and 245, as shown in FIG. 12.

Figure 19:
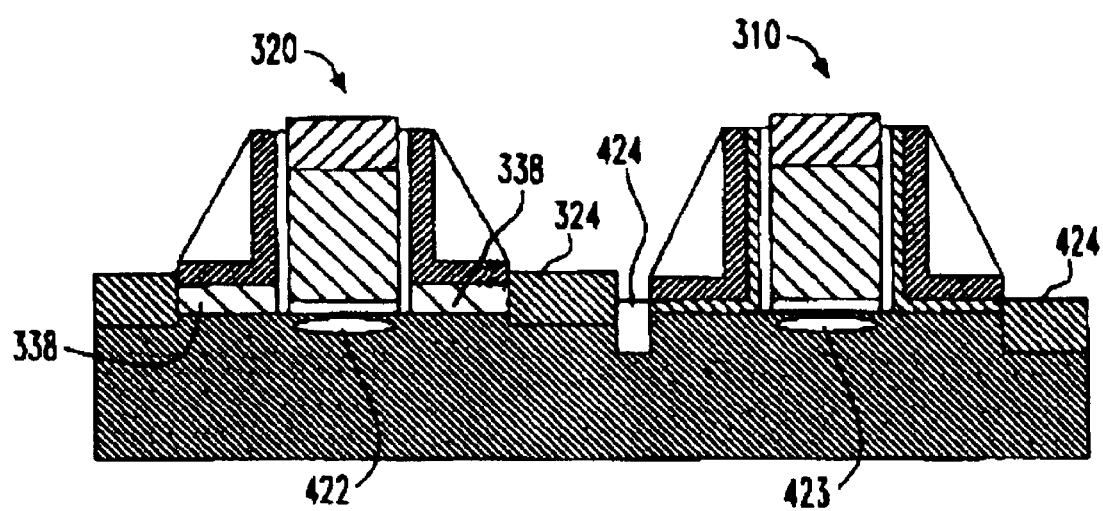
FIGS. 19 through 21 illustrate stages in fabrication of a PFET and an NFET according to yet another embodiment of the invention.
Figure 20:
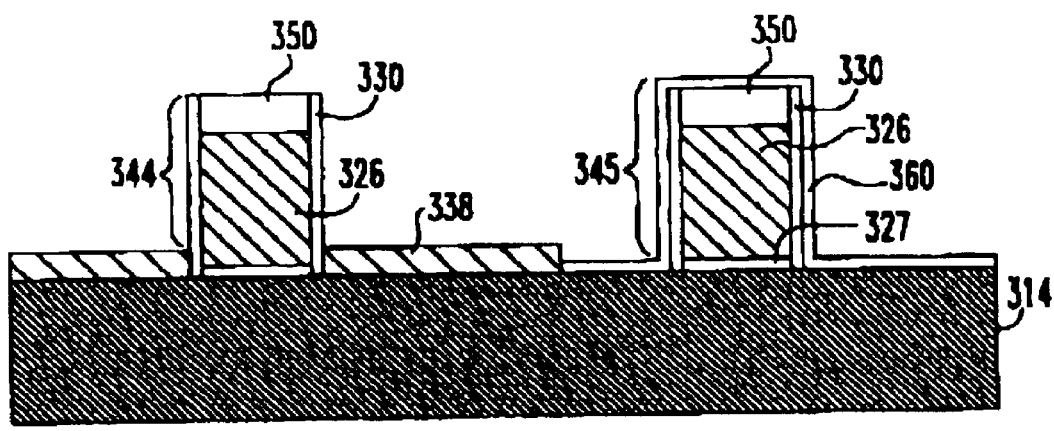
Figure 21:
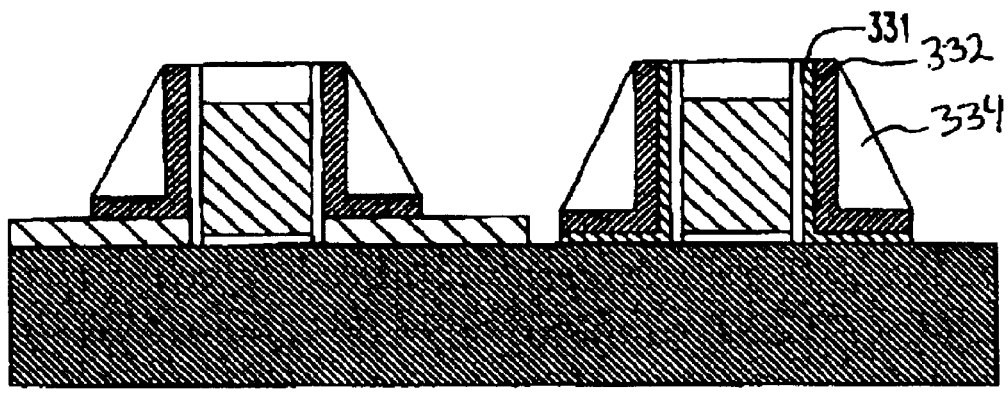

A further embodiment of the invention is illustrated in FIGS. 19–21. In contrast to the embodiment illustrated relative to FIGS. 12–18, in this embodiment, the silicon germanium layer 338 does not form a part of the NFET structure 310, as shown in FIG. 19. Rather, that layer 338 is disposed only in the PFET structure 320. In such manner, a compressive stress is applied to the channel region 422 of the PFET 320 but not to the channel region 423 of the NFET 310.

A process for fabricating the PFET 320 and NFET 310 is illustrated in FIGS. 20 and 21. As shown in FIG. 20, a PFET gate stack 344 and an NFET gate stack 345 are formed, each including a polysilicon gate 326 overlying a gate dielectric 327 preferably consisting of a thermally grown oxide, an insulating cap 350, preferably including silicon nitride, and a first pair of spacers 330, preferably including silicon nitride. Halo and extension implants can be performed at this time.

Thereafter, a conformal material layer 360 is deposited and then patterned to cover only the active areas of the single-crystal semiconductor region 314 adjacent to the NFET gate stack 345. Such conformal material layer can illustratively be an oxide, a nitride, or a combination of both. Preferably, the conformal material layer 360 includes a nitride such as silicon nitride. Thereafter, a lattice-mismatched semiconductor 338 such as silicon germanium is epitaxially grown onto the exposed active areas of the single-crystal region 314 adjacent to the PFET gate stack 344.

Thereafter, as illustrated in FIG. 21, additional insulating layers are deposited over the conformal layer 360 and then the layers are vertically etched, as by RIE to form spacers 331 and additional spacers 332 and 334 in a manner such as that described above with reference to FIG. 18. Thereafter, as shown in FIG. 12, self-aligned silicide regions 324 and 424 are preferably formed in both the PFET 320 and NFET 310, in a manner such as that described above relative to FIG. 12.

While the invention has been described with reference to certain preferred embodiments thereof, those skilled in the art will understand the many modifications and enhancements which can be made without departing from the true scope and spirit of the invention, which is limited only by the appended claims.

What is claimed is:

1. An integrated circuit having complementary metal oxide semiconductor (CMOS) transistors including a p-type field effect transistor (PFET) and an n-type field effect transistor (NFET), each said NFET and said PFET having a channel region disposed in a single-crystal layer of a first semiconductor, wherein a stress is applied at a first magnitude to a channel region of said PFET but not to a channel region of said NFET by a layer of a second semiconductor which is lattice-mismatched to said first semiconductor, said layer of said second semiconductor being formed in source and drain regions of said PFET a first distance from said channel region of said PFET, and said layer of said second semiconductor further being formed in source and drain regions of said NFET at a second distance from said channel region of said NFET, said second distance being greater than said first distance.

2. The integrated circuit of claim 1 wherein said first semiconductor and said second semiconductor are silicon containing semiconductor materials having a composition according to the formula $Si_xGe_y$, wherein x and y are percentages, said first semiconductor ranging in composition between x=100, y=0 to x=1, y=99, and said second semiconductor ranging in composition between x=99, y=1 to x=1, y=99, wherein x for said second semiconductor is always less than x for said first semiconductor.

3. The integrated circuit of claim 1 wherein said single-crystal region of said first semiconductor has a main surface defined by a level of a gate dielectric formed on said channel regions of said NFET and said PFET and said layer of said second semiconductor is formed above said main surface.

4. The integrated circuit of claim 3 further comprising a layer of silicide formed over said layer of said second semiconductor.

5. The integrated circuit of claim 1 wherein said first semiconductor consists essentially of a semiconductor selected from the group consisting of silicon, silicon germanium and silicon carbide and said second semiconductor consists essentially of another semiconductor different from said first semiconductor, said another semiconductor selected from the group consisting of silicon, silicon germanium and silicon carbide.

6. The integrated circuit of claim 1 wherein said first semiconductor consists essentially of silicon and said second semiconductor consists essentially of silicon germanium.

7. The integrated circuit of claim 1 wherein said first semiconductor consists essentially of silicon germanium according to a first formula $Si_{x1}Ge_{x1}$, where x1 and y1 are percentages, x1+y1=100%, y1 being at least one percent and said second semiconductor consists essentially of silicon germanium according to a second formula $Si_{x2}Ge_{y2}$, where x2 and y2 are percentages, x2+y2=100%, y2 being at least one percent, wherein x1 is not equal to x2 and y1 is not equal to y2.

8. The integrated circuit of claim 1 wherein said first stress is a compressive stress.

9. The integrated circuit of claim 6 wherein said second semiconductor consists essentially of silicon germanium having a germanium content of at least one percent.

10. The integrated circuit of claim 4 wherein a said layer of silicide contacts said gate conductors, said source regions and said drain regions of said PFET and said NFET.

11. An integrated circuit having complementary metal oxide semiconductor (CMOS) transistors including a p-type field effect transistor (PFET) and an n-type field effect transistor (NFET), each said NFET and said PFET having a channel region disposed in a single-crystal layer of a first semiconductor, wherein a first stress is applied to a channel region of said PFET but not to a channel region of said NFET by a layer of a second semiconductor lattice-mismatched to said first semiconductor being formed in raised source and drain regions of said PFET, said layer of said second semiconductor not being formed in raised source and drain regions of said NFET.

12. An integrated circuit having complementary metal oxide semiconductor (CMOS) transistors including a p-type field effect transistor (PFET) and an n-type field effect transistor (NFET) each having channel regions disposed in single-crystal silicon regions of a substrate wherein a first stress is applied to the channel region of the PFET but not to the channel region of the NFET via a raised lattice-mismatched semiconductor layer consisting essentially of silicon germanium disposed in source and drain regions of the PFET a first distance from said channel region of said PFET and disposed in source and drain regions of the NFET a second distance from said channel region of said NFET, said silicon germanium having a composition according to the formula $Si_xGe_y$, where x and y are percentages each being at least one percent, x plus y equaling 100 percent.

* * * * *